United States Patent
Lin

(10) Patent No.: US 6,375,485 B1
(45) Date of Patent: Apr. 23, 2002

(54) ZERO INSERTED FORCE SOCKET

(75) Inventor: Nick Lin, Hsin-Chuang (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/752,025

(22) Filed: Dec. 29, 2000

(30) Foreign Application Priority Data

Dec. 1, 2000 (TW) .......................................... 89220927

(51) Int. Cl.[7] .............................................. H01R 13/62
(52) U.S. Cl. ...................................... 439/342; 439/526
(58) Field of Search ................................ 439/259–270, 439/73, 72, 342, 526

(56) References Cited

U.S. PATENT DOCUMENTS

| | | | | |
|---|---|---|---|---|
| 5,730,615 A | * | 3/1998 | Lai et al. ..................... | 439/342 |
| 6,059,596 A | * | 5/2000 | Pei et al. ..................... | 439/342 |
| 6,142,810 A | * | 11/2000 | Hsiao et al. ................. | 439/342 |
| 6,159,032 A | * | 12/2000 | McHugh et al. ............. | 439/342 |
| 6,217,361 B1 | * | 4/2001 | Murr .......................... | 439/342 |

* cited by examiner

Primary Examiner—Hien Vu
(74) Attorney, Agent, or Firm—Wei Te Chung

(57) ABSTRACT

A ZIF socket (1) includes a base (11), a plurality of terminals (14) received in the base and a cover (12) slideably mounted on the base. Each terminal has a resilient arm (141) having an arced section (143) and an engaging section 142 for engaging with corresponding pins (131) of a chip module (13). The cover has a plurality of holes (120) for the pins of the chip module to extend therethrough. Each hole has a shape and area similar to those of a space surrounded by the arced section of the resilient arm of a corresponding terminal.

1 Claim, 4 Drawing Sheets

ZERO INSERTED FORCE SOCKET

BACKGROUND OF THE INVENTION

1. Field of the Invention

The present invention relates to a socket, and particularly to a Zero Inserted Force (hereinafter ZIF) socket for connecting a chip module to a mother board.

2. Description of the Related Art

To facilitate a chip module to connect with a mother board, a ZIF connector is usually used. The ZIF socket generally comprises a base and a cover for carrying the chip module. Referring to FIG. 5, the base defines a plurality of holes 21 receiving pluralities of terminals 31 therein. The cover defines a plurality of circular openings 23. The chip module comprises a plurality of pins 41 for contacting with the terminals 31 of the ZIF socket. When mating, each pin 41 is inserted through a corresponding opening 23 and further into a corresponding hole 21. The cover is moved relative to the base, to cause the pins 41 of the chip module to electrically connect with the terminals 31 of the ZIF socket. As the position of the pins 41 is not always so accurate that when the pins 41 are inserted through the circular openings 23 of the cover, an interference between the pins 41 and the cover may occur, which results that an insertion force is needed to mount the chip module to the ZIF socket. As the pins 41 of the chip module is designed for zero force insertion, the needed insertion force may cause a damage of the pins 41.

Hence, an improved socket is required to overcome the disadvantages of the prior art.

BRIEF SUMMARY OF THE INVENTION

A main object of the present invention is to provide a ZIF socket having an improved cover that can facilitate a chip module to be mounted to the socket without the danger to damage pins of the chip module.

In order to achieve the object, a ZIF socket for mating with a chip module which has a plurality of downwardly extending pins includes a rectangular base, a plurality of terminals and a rectangular cover slideably assemblied on the base. The base has a plurality of passageways therein for receiving the plurality of terminals. Each terminal has a stem having a stem having an interferential engagement with the base, a resilient arm above the stem and a solder foot below the stem for surface mounting to a mother board. Each pin of the chip module extends through a hole defined in the cover into a corresponding passageway to be received in a space surrounded by an arced section of the resilient arm when the cover is at an opened position. When the cover is moved relative to the base to a closed position, the pin is moved by the cover to engage with an engaging section of the resilient arm to establish an electrical connection between the chip module and the mother board through the terminal. The hole has a shape and area similar to those of the space defined by the arced section of the resilient arm so that even if the pin is a little deviated from its required position, the pin can extend through the hole without having an interference with the cover.

Other objects, advantages and novel features of the invention will become more apparent from the following detailed description of the present embodiment when taken in conjunction with the accompanying drawings.

DETAILED DESCRIPTION OF THE INVENTION

Figure 1:
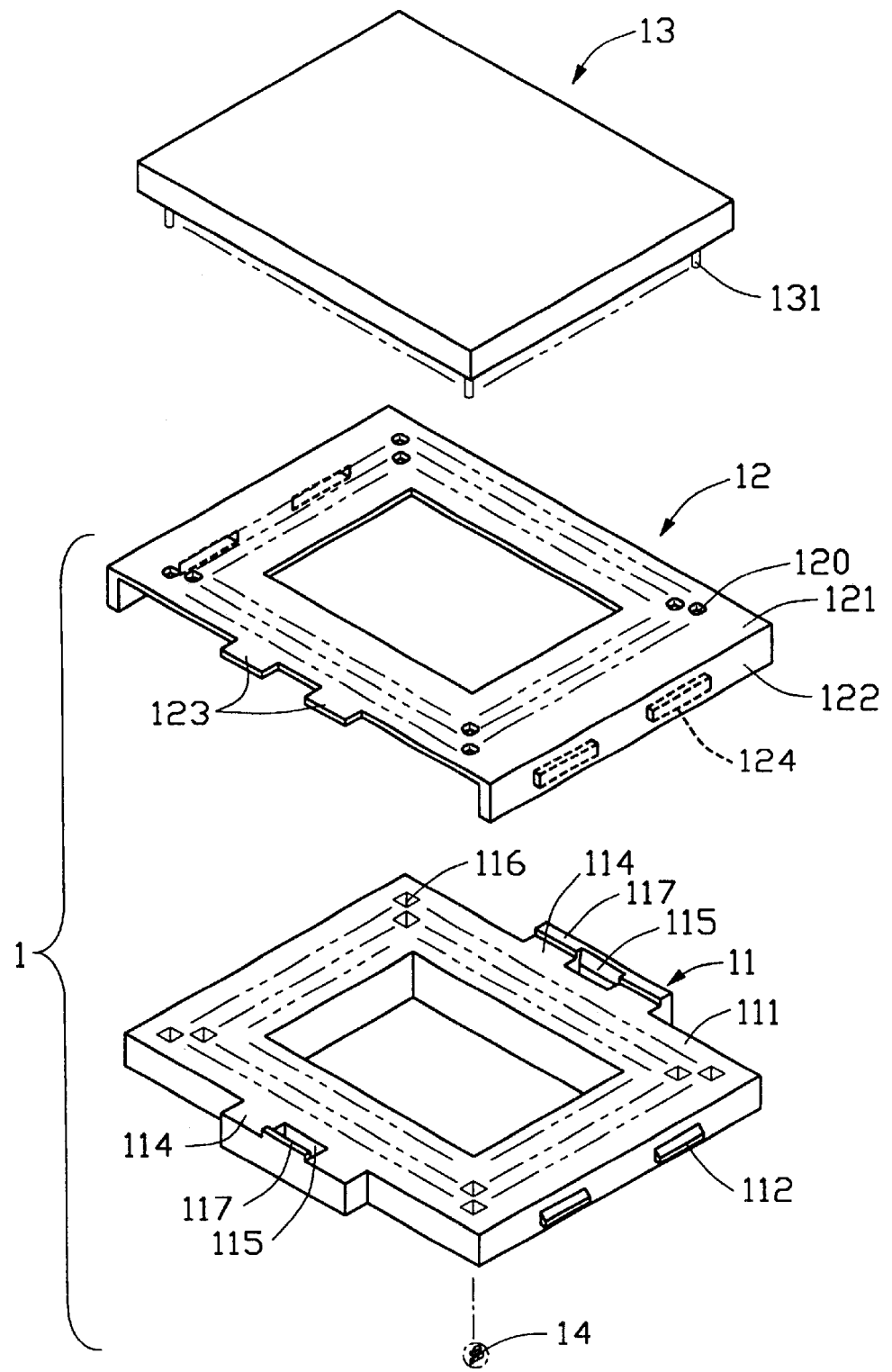
FIG. 1 is an exploded view of a ZIF socket in accordance with the present invention and a corresponding chip module.

Referring to FIG. 1, a ZIF socket 1 in accordance with the present invention comprises a rectangular base 11, a rectangular cover 12 and a plurality of terminals 14 received in passageways 116 defined in the base 11.

The base 11 has an upper surface 111. Two platforms 114 extend from two opposite sides of the base 11. An opening 115 is defined in each platform 114, and a baffle 117 is formed at an outer edge of the platform 114. Two protrusions 112 are formed on each of the other two opposite sides of the base 11, extending outwards from the base 11. In addition, the passageways 116 are defined in a center portion of the base 11.

The cover 12 comprises a main body 121 and a plurality of holes 120 defined therethrough. Two appendages 122 extend downwardly from two opposite edges of the main body 121, respectively, and two projections 123 extend from one of two other opposite side edges of the main body 121. A plurality of holes 120 are defined in a center of the main body 121. Each appendage 124 defines two inner recesses 124 therein.

The cover 12 comprises a main body 121 and a plurality of holes 120 defined therethrough. Two appendages 122 extend downwardly from two opposite edges of the main body 121, respectively, and two projections 123 extend from one of two other opposite side edges of the main body 121. A plurality of holes 120 are defined in a center of the main body 121. Each appendage 124 defines two inner recesses 122 therein.

Figure 2:
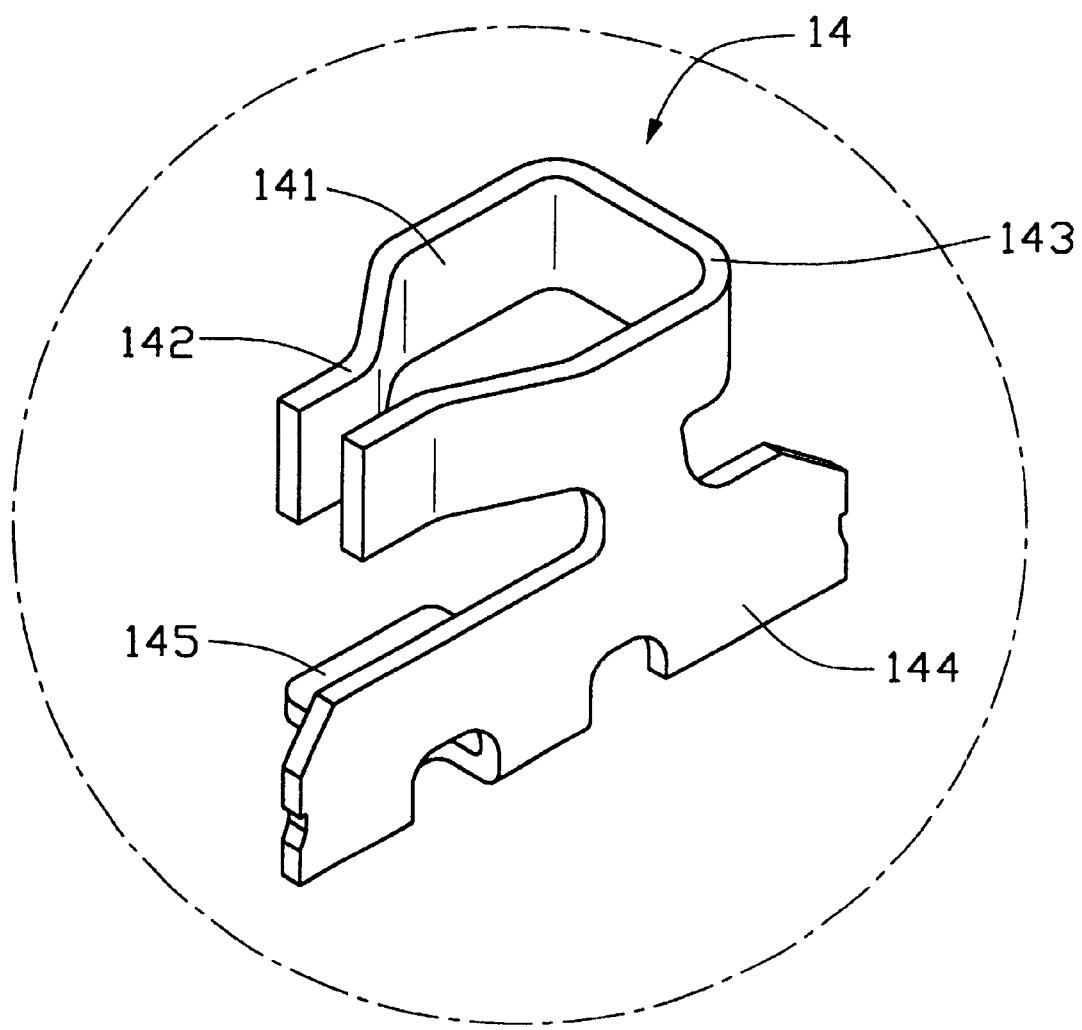
FIG. 2 is an enlarged perspective view of a terminal of in the ZIF socket.

Also referring to FIG. 2, each terminal 14 has a middle stem 144, a resilient arm 141 extending upwardly from the middle stem 144, and a soldering foot 145 extending downwardly from the middle stem 144, wherein the resilient arm 141 further includes an arced section 143 integrally formed from the middle stem 144, and an engaging section 142 at a free end for engaging with the pin 131.

Figure 3:
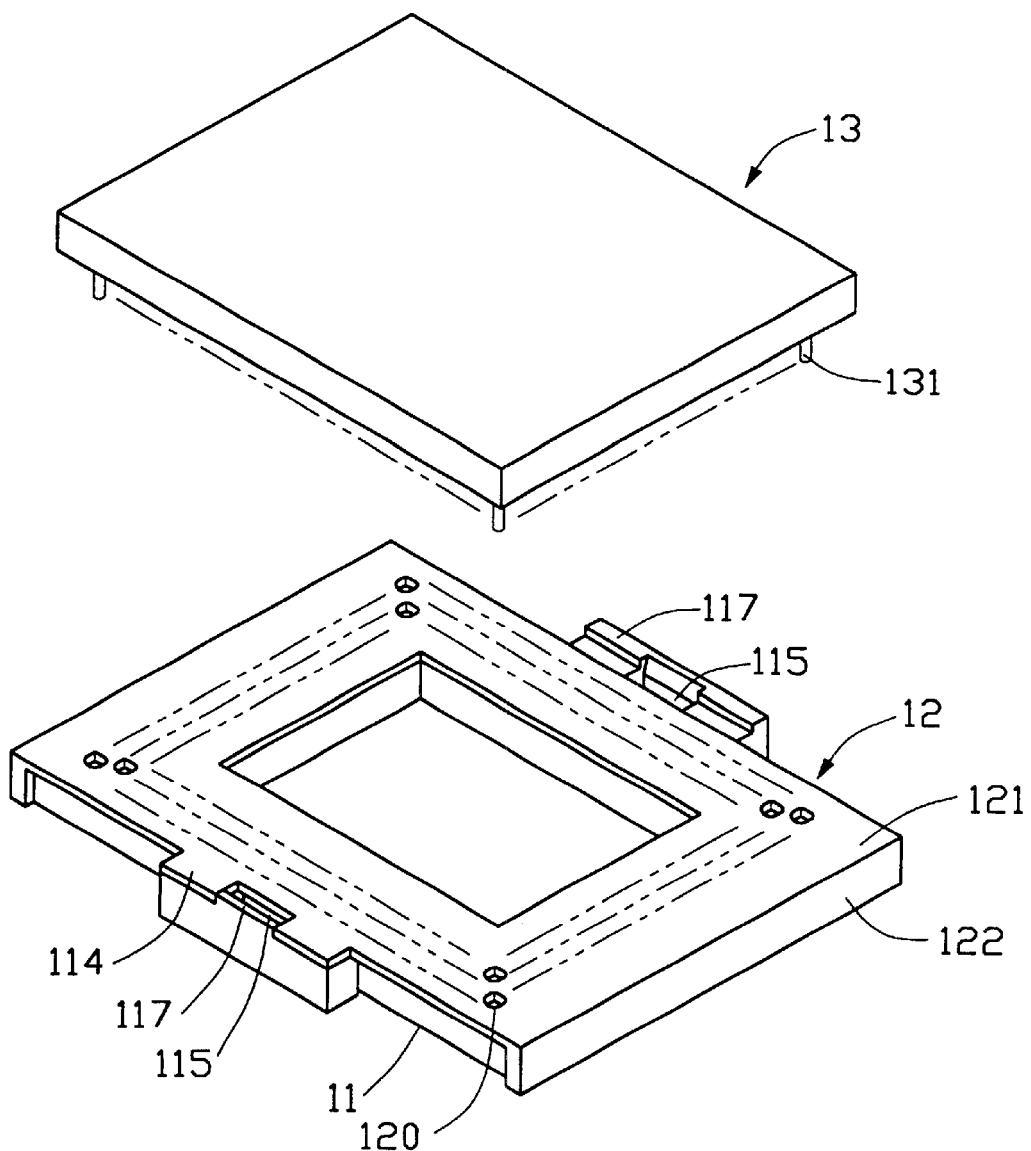
FIG. 3 is an assembled view of the ZIF socket of FIG. 1 and the chip module.
Figure 4:
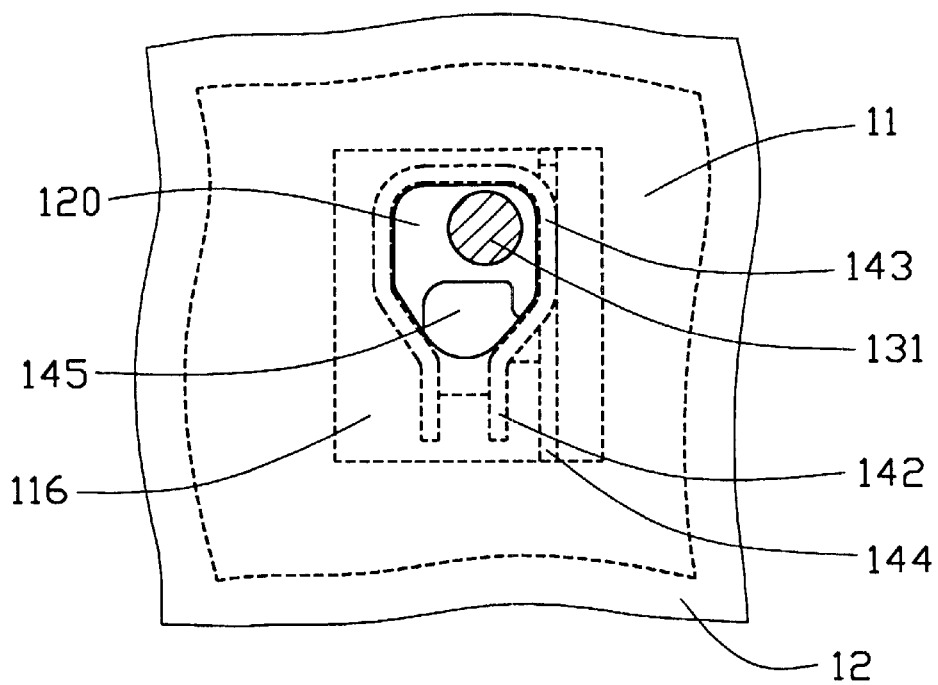
FIG. 4 is a partially enlarged top view of the ZIF socket of the present invention with a pin of the chip module received therein.
Figure 5:
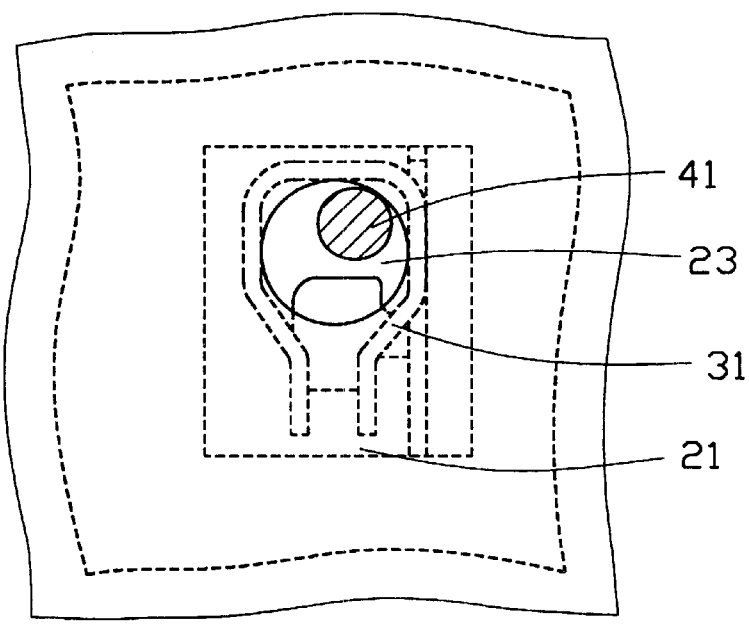
FIG. 5 is a partially enlarged top view of a conventional ZIF socket with a pin of a chip module received therein.

In assembly, referring to FIG. 4, the terminals 14 are inserted into the corresponding passageways 116 of the base 11, wherein the middle stem 144 of each terminal 14 engages with the base 11 for retaining the terminal 14 in the passageway 116. Also referring to FIG. 3, the cover 12 is assembled with the base 11 by fitting the protrusions 112 into the recesses 124 so that the cover 12 is slideable relative to the base 11 between open and closed position. To move the cover 12 between the two positions, a tip of a cool (for example, a flat screwdriver) is inserted into a selected one of the openings 115 and has a pivoting movement about the hole thereby moving the cover 12 relative to the base 11. The socket 1 is electrically connected to the mother board by surface mounting the solder feet 145 to corresponding contact points on the mother board.

In mounting the chip module 13 to the socket 1, firstly the pins 131 of the chip module 13 are inserted through the holes 120 and into the passageways 116, wherein each pin 131 is located in a space surrounded by the arced section 143 of the terminal 14; the cover 12 is then drivers to move relative to the base 11 thereby causing the pins 131 to move accordingly to reach the engaging sections 142 to engage therewith; thus, an electrical connection between the chip module 13 and the mother board to which the socket 1 is soldered is established.

In the present invention, each hole 120 is so configured that it has a shape and area substantially the same as those of the space delineated by a corresponding arced section 143 of the resilient arm 141 of the terminals 14. Such a configuration of the hole 120 permits the pin 131 to freely extend therethrough even if the position of the pin 131 is a little deviated from its required position, while when the cover 12 is moved relative to the base 11, the cover 12 can effectively move the pin 131 to engage with the engaging section 142 of the terminal 14.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket for a chip module which has a plurality of pins thereon, the socket comprising:

a base having a plurality of passageways therein;

a plurality of terminals being received in the passageways, each terminal having a middle stem, a resilient arm having an engaging section at a free end thereof for engaging with a corresponding pin of the chip module and an arced section, said resilient arm extending upwardly from said middle stem and a soldering foot extending downward from said middle stem; and a cover being slideably mounted on the base and having a plurality of holes for the pins to extend therethrough, each hole having a shape and area similar to a space surrounded by the arced section of the resilient arm of the terminal;

wherein the shape of the hole is non-circular;

wherein two platforms extended from two opposite sides of the base, and each platform includes an opening for insertion of a tool there into; and wherein a plurality of recesses are defined in two sides of the cover, and the base has protrusions fitting into the recesses.

* * * * *